(12) United States Patent
Brown

(10) Patent No.: US 6,980,481 B1
(45) Date of Patent: Dec. 27, 2005

(54) ADDRESS TRANSITION DETECT CONTROL CIRCUIT FOR SELF TIMED ASYNCHRONOUS MEMORIES

(75) Inventor: Jeffrey S. Brown, Fort Collins, CO (US)

(73) Assignee: LSI Logic Corporatiion, Milpitas, CA (US)

( * ) Notice: Subject to any disclaimer, the term of this patent is extended or adjusted under 35 U.S.C. 154(b) by 307 days.

(21) Appl. No.: 10/028,582

(22) Filed: Dec. 20, 2001

(51) Int. Cl.$^7$ ............... G11C 8/00; G11C 7/00
(52) U.S. Cl. ............... 365/233.5; 365/189.05; 365/189.08; 365/189.09; 365/196; 365/203; 365/205; 365/207; 365/230.08
(58) Field of Search ............... 365/233.5, 230.08, 365/207, 189.96, 189.05, 189.08, 189.09, 365/196, 203, 205

(56) References Cited

U.S. PATENT DOCUMENTS

| | | | |
|---|---|---|---|
| 3,911,929 A * | 10/1975 | Gobeli ............... 607/9 |
| 4,185,324 A * | 1/1980 | Ward ............... 365/222 |
| 5,014,247 A * | 5/1991 | Albachten et al. ...... 365/230.05 |
| 5,438,551 A * | 8/1995 | Sakata ............... 365/233.5 |
| 5,532,964 A * | 7/1996 | Cernea et al. ......... 365/189.09 |
| 5,625,598 A * | 4/1997 | Oba ............... 365/203 |
| 5,650,979 A * | 7/1997 | Komarek et al. ........ 365/233.5 |
| 5,717,638 A * | 2/1998 | Kim ............... 365/189.04 |
| 5,740,111 A * | 4/1998 | Duesman ............... 365/189.09 |
| 5,809,312 A * | 9/1998 | Ansel et al. ............... 713/300 |
| 5,999,482 A * | 12/1999 | Kornachuk et al. ......... 365/233 |
| 6,144,589 A * | 11/2000 | Micheloni et al. ...... 365/189.11 |
| 2001/0014046 A1 * | 8/2001 | Sakamoto ............... 365/205 |
| 2002/0001246 A1 * | 1/2002 | Hidaka ............... 365/222 |
| 2002/0079543 A1 * | 6/2002 | Yokozeki et al. ........... 257/372 |
| 2002/0145933 A1 * | 10/2002 | Nakagawa ............ 365/230.03 |
| 2003/0086319 A1 * | 5/2003 | Fujimoto et al. ........... 365/200 |
| 2003/0112668 A1 * | 6/2003 | Takahashi et al. ........... 365/200 |

FOREIGN PATENT DOCUMENTS

EP        311136 A2 *  4/1989  .......... H03K 3/037

* cited by examiner

Primary Examiner—Tan T. Nguyen
Assistant Examiner—Ly Duy Pham
(74) Attorney, Agent, or Firm—Christopher P. Maiorana PC (57) ABSTRACT

A memory circuit generally comprising a bit cell, a sense amplifier, and a control circuit. The bit cell may be configured to generate a bit signal. The sense amplifier may be configured to generate a reset signal in response to sensing the bit signal. The control circuit may be configured to (i) set a control latch in response to a detection signal and (ii) reset the control latch in response to the reset signal, wherein the control latch is set while both the detection signal and the reset signal are in an asserted state.

24 Claims, 5 Drawing Sheets

ADDRESS TRANSITION DETECT CONTROL CIRCUIT FOR SELF TIMED ASYNCHRONOUS MEMORIES

FIELD OF THE INVENTION

The present invention relates to a method and/or architecture for asynchronous memory control generally and, more particularly, to a method and/or architecture for asynchronous memory circuits using address transition detect logic for memory self timing.

BACKGROUND OF THE INVENTION

Conventional asynchronous memory circuits are triggered internally by an address transition detection to initiate read and write accesses. The address transition detection produces a self timing event that cycles the memory circuit through the selected access. The conventional asynchronous memory circuits have difficulty correctly restarting the self timing event in the middle of a cycle. Restarting the self timing event during an address transition timing space will not always produce consistent results. Holes in the address transition timing space commonly produce functional failures.

SUMMARY OF THE INVENTION

The present invention concerns a memory circuit generally comprising a bit cell, a sense amplifier, and a control circuit. The bit cell may be configured to generate a bit signal. The sense amplifier may be configured to generate a reset signal in response to sensing the bit signal. The control circuit may be configured to (i) set a control latch in response to a detection signal and (ii) reset the control latch in response to the reset signal, wherein the control latch is set while both the detection signal and the reset signal are in an asserted state.

The objects, features and advantages of the present invention include providing a method and/or architecture for asynchronous memory circuits using address transition detect logic for memory self timing that may (i) remove holes in the address transition space and/or (ii) provide a redundant approach to guarantee functional performance.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
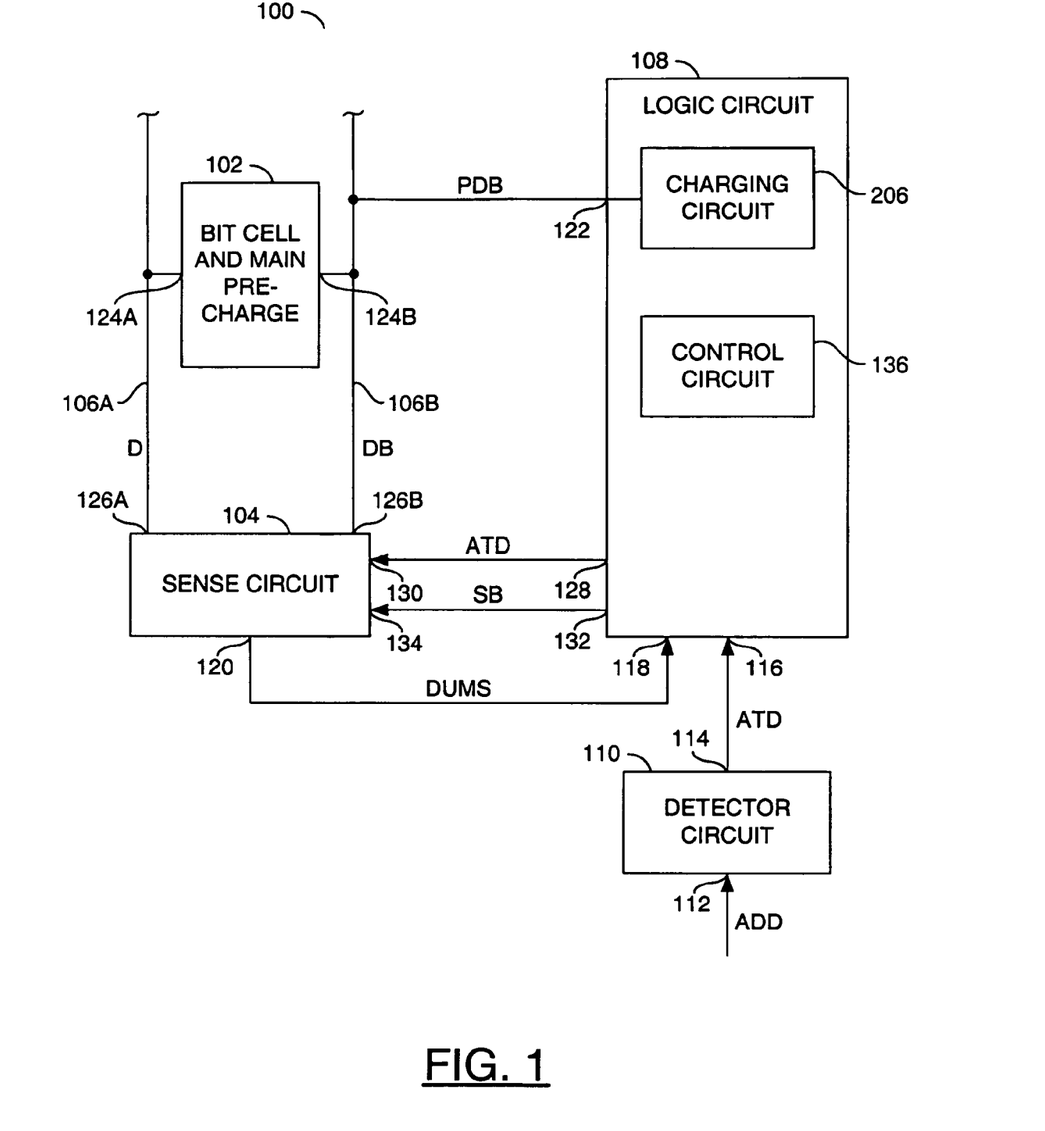
FIG. 1 is a block diagram of a preferred embodiment of the present invention.

Referring to FIG. 1, a block diagram of a memory circuit 100 is shown in accordance with a preferred embodiment of the present invention. The present invention generally concerns an asynchronous memory control architecture using address transition detect logic for memory self timing within the memory circuit 100. Therefore, the memory circuit 100 may be generally insensitive to a rapidly changing address signal (e.g., ADD) and skews among the individual bits of the address signal ADD. Several reset points within the memory circuit 100 may guarantee a clean halt from a currently running self time cycle and a clean transition to a new self timing cycle upon detection of an address transition.

The memory circuit 100 generally comprises multiple bit cells with main bit line precharge circuits 102 coupled to multiple sense circuits 104 by multiple bit lines 106, a logic circuit 108, a detection circuit 110. Only one bit cell/precharge circuit 102, one pair of bit lines 106A–B, and one sense circuit 104 are shown for clarity. Other implementations of the memory circuit 100 may be provided to meet the design criteria of a particular application.

The bit cell/precharge circuit 102 shown may be implemented as a dummy bit cell/precharge circuit. The bit lines 106A–B shown may be implemented as dummy bit lines. The sense circuit 104 shown may be implemented as a dummy sense circuit. The dummy bit cell/precharge circuit 102 may differ from the other bit cell/precharge circuits of the memory circuit 100 in that the dummy bit cell/precharge circuit 102 may have a fixed logic value that may not be altered by a write cycle. The dummy sense circuit 104 may differ from other sense circuits of the memory circuit 100 in that the dummy sense circuit 104 may generate a control signal instead of data.

The detection circuit 110 may have an input 112 to receive the address signal ADD. An output 114 of the detection circuit 110 may present a signal (e.g., ATD) to an input 116 of the logic circuit 108. The logic circuit 108 may have an input 118 to receive a signal (e.g., DUMS) from an output 120 of the dummy sense circuit 104. The logic circuit 108 may have an output 122 to present a signal (e.g., PDB) to the dummy bit line 106B. The dummy bit cell/precharge circuit 102 may have an interface 124A to present a signal (e.g., D) to the dummy bit line 106A. The dummy bit cell/precharge circuit 102 may have an interface 124B to present a signal (e.g., DB) to the dummy bit line 106B. The dummy sense circuit 104 may have a pair of interfaces 126A–B coupled to the dummy bit lines 106A–B to receive the signals D and DB. The logic circuit 108 may have an output 128 to present the signal ATD to an input 130 of the dummy sense circuit 104. The logic circuit 108 may also have an output 132 to present a signal (e.g., SE) to an input 134 of the dummy sense circuit 104.

The address signal ADD may be implemented as a multiple-bit address signal provided to the memory circuit 100 from an external source (not shown). The signal ATD may be implemented as an address transition detect signal that may have an asserted state and a de-asserted state. The signal ATD may be asserted in a logical HIGH state and de-asserted in the logical LOW state. The signal DUMS may be implemented as a dummy sense signal and/or a reset signal having another asserted state and another de-asserted state. The signal DUMS may be asserted in the logical LOW state and de-asserted in the logical HIGH state. The signal PDB may be implemented as a pull-up signal for the dummy bit line 106B. The signal D may be implemented as a data signal. The signal DB may be implemented as a data bar signal. The signal DB may sometimes equal the signal D and at other times equal an inverse of the signal D. A combination of the signal D and the signal DB may be referred to as a dummy bit signal.

The detection circuit 110 may detect a change in the address signal ADD to generate the signal ATD. The signal ATD may be generated as a pulse for each transition detected for the address signal ADD. The pulse generally comprises a leading edge and a trailing edge separated in time by a predetermined period. The leading edge may be a transition from the logical LOW state to the logical HIGH state. The trailing edge may be a transition from the logical HIGH state back to the logical LOW state.

The logic circuit 108 may trigger on the leading edge of the signal ATD. Leading edge triggering of the logic circuit 108 may cause (i) the dummy bit lines 106A–B to reset to a predefined voltage and/or charge, (ii) the dummy sense circuit 104 to reset and/or (iii) the dummy sense circuit 104 to generate the signal DUMS in the de-asserted state. The signal PDB may be asserted in the logical HIGH state to reset the signal DB.

The logic circuit 108 may trigger on the trailing edge of the signal ATD. Trailing edge triggering of the logic circuit 108 may (i) release the dummy bit lines 106A–B and (ii) enable the dummy sense circuit 104 to sense the signals D and DB. The fixed logic value of the dummy bit cell/precharge circuit 102 may retain a charge on the dummy bit line 106A and discharge the dummy bit line 106B. The discharge of the dummy bit line 106B generally causes the signal DB to fall away from the signal D. The dummy sense circuit 104 may generate the signal DUMS in the asserted state when the signal D and the signal DB achieve a predetermined voltage separation. The assertion of the signal DUMS may indicate to the logic circuit 108 that the other sense circuits should have completed sensing values from the other bit cells.

Figure 2:
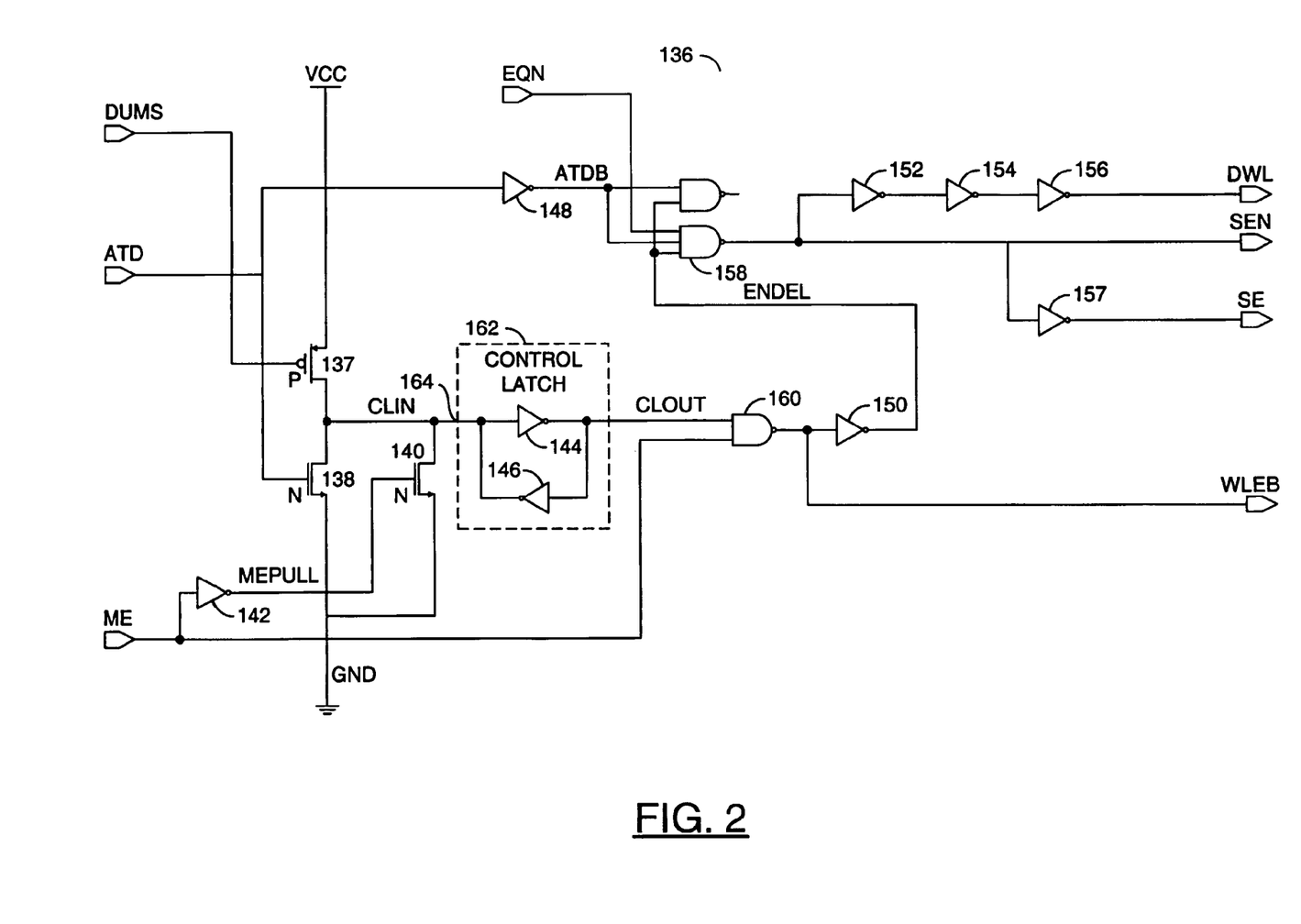
FIG. 2 is a schematic illustrating an example control circuit.

Referring to FIG. 2, a schematic of an example circuit 136 implementing a control circuit is shown. The control circuit 136 generally controls cycles of the memory circuit 100. The control circuit 136 generally comprises (i) transistors 137, 138 and 140, (ii) inverters 142, 144, 146, 148, 152, 154, 156 and 157 and (iii) logic gates 158 and 160. Other implementations may be provided to meet the design criteria of a particular application.

The inverters 144 and 146 may be configured as a control latch circuit 162. The control latch circuit 162 may have an input 164 to receive a signal (e.g., CLIN). The control latch circuit 162 may present a signal (e.g., CLOUT). The logic gates 158 and 160 may be implemented as logical NAND gates.

The transistor 137 may be implemented as a p-channel MOS transistor. The transistor 137 may be configured as a pull-up transistor. A gate of the transistor 137 may receive the signal DUMS. A source of the transistor 137 may be coupled to the input 164. A drain of the transistor 137 may be coupled to a power source (e.g., VCC).

The transistor 138 may be implemented as an n-channel MOS transistor. The transistor 138 may be configured as a pull-down transistor. A gate of the transistor 138 may receive the signal ATD. A source of the transistor 138 may be coupled to the input 164. A drain of the transistor 138 may be coupled to a power return (e.g., GND).

The transistor 140 may also be implemented as an n-channel MOS transistor. A gate of the transistor 140 may receive a signal (e.g., MEPULL). A source of the transistor 140 may be coupled to the input 164. A drain of the transistor 140 may be coupled to the power return GND.

The inverter 142 may receive a signal (e.g., ME) and generate the signal MEPULL. The 148 may receive the signal ATD and generate a signal (e.g., ATDB). The inverter 150 may receive a signal (e.g., WLEB) and generate a signal (e.g., ENDEL). The inverters 152, 154 and 156 may be configured to implement a single inverting operation. The inverter 152 may receive a signal (e.g., SEN). The inverter 156 may generate a signal (e.g., DWL). The inverter 157 may receive the signal SEN and generate the signal SE. The logic gate 158 may receive the signal ATDB, receive the signal ENDEL, and receive a signal (e.g., EQN). The logic gate 158 may generate the signal SEN. The logic gate 160 may receive the signals CLOUT and ME. The logic gate 160 may generate the signal WLEB.

The signal ME may be implemented as a memory enable signal. The signal MEPULL may be implemented as a memory enable pull-down signal and/or a logical inverse of the signal ME. The signal CLIN may be implemented as a control latch input signal. The signal CLOUT may be implemented as a control latch output signal and/or a logical inverse of the signal CLIN. The signal EQN may be implemented as an equalization bar signal and/or a logical inverse of a precharge signal (not shown). The signal ATDB may be implemented as an address transition detect bar signal and/or a logical inverse of the signal ATD. The signal SEN may be implemented as a sense enable bar signal and/or a logical inverse of the signal SE. The signal WLEB may be implemented as a word line enable bar signal. The signal ENDEL may be implemented as a control latch enable delayed signal and/or a logical inverse of the signal WLEB. The signal DWL may be implemented as a dummy word line control signal and/or a logical inverse of the signal SEN.

The transistor 137 may implement a reset function. While the signal DUMS is in the asserted state and the signal ATD is in the de-asserted state, the transistor 137 may pull the signal CLIN to a reset state (e.g., the logical HIGH state). The transistor 138 may implement a set function. While the signal DUMS is in the de-asserted state and the signal ATD is in the asserted state, the transistor 138 may pull the signal CLIN to a set state (e.g., the logical LOW state). The transistor 138 may be have a strong conductance as compared with the transistor 137. The stronger conductance may allow the transistor 138 to overpower the transistor 137 while both transistors are conducting. Therefore, while both the signal ATD and the signal DUMS are in the asserted state, the transistor 138 may pull the signal CLIN to the set state.

Figure 3:
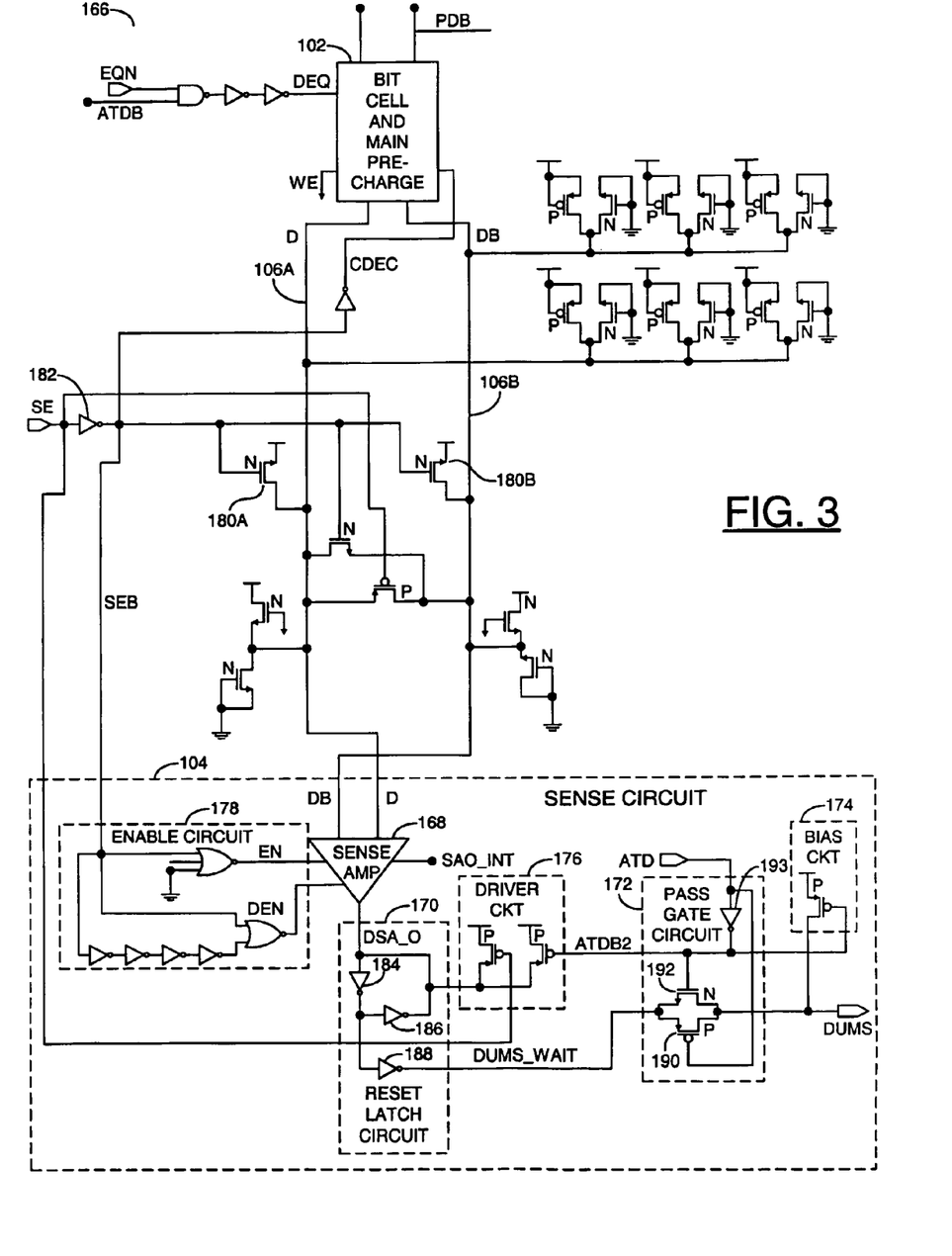
FIG. 3 is a schematic of an example implementation of a dummy bit cell/precharge circuit, a dummy bit line pair, and a dummy sense circuit.

Referring to FIG. 3, a block diagram of an example circuit 166 implementing the dummy sense circuit 104, dummy bit lines 106A–B, and the dummy bit cell/precharge circuit 102 is shown. The dummy sense circuit 104 generally comprises a dummy sense amplifier 168, a reset latch circuit 170, a pass gate circuit 172, a bias circuit 174, a driver circuit 176, and an enable circuit 178. The circuit 166 may also comprise a pair of precharge transistors 180A–B coupled to the dummy bit lines 106A–B respectively, an inverter 184, and an inverter 186. Additional logic gates, inverters, and transistor may be provided in the circuit 166 to support the dummy bit cell selection, precharging, and sensing operations to meet the design requirements of a particular application.

The inverter 182 may receive the signal SE from the logic circuit 108. The inverter 182 may generate and present a signal (e.g., SEB) to the precharge transistors 180A–B and the enable circuit 178. The enable circuit 178 may generate and present a signal (e.g., EN) and a signal (e.g., DEN) to the dummy sense amplifier 168. The dummy sense amplifier 168 may also receive the signals D and DB from the dummy bit lines 106A–B. The dummy sense amplifier 168 may generate and present a signal (e.g., DSA_O) to the reset latch circuit 170. The reset latch circuit 170 may generate and present a signal (e.g., DUMS_WAIT) to the pass gate circuit 172. The pass gate circuit 172 may receive the signal ATD from the logic circuit 108. The pass gate circuit 172 may generate and present a signal (e.g., ATDB2) to the driver circuit 176. The bias circuit 174 may bias the signal DUMS to the de-asserted state. The driver circuit 176 also receive the signal SE.

The signal SEB may be implemented as a sense amplifier enable bar signal and/or a logical inverse of the signal SE. The signal EN may be implemented as a dummy sense amplifier enable signal and/or logical inverse of the signal SEB. The signal DEN may be implemented as an output driver enable signal. The signal DSA_O may be implemented as a dummy sense amplifier output signal. The signal DUMS_WAIT may be implemented as a reset signal. The signal ATDB2 may be implemented as an address transition detect bar signal and/or a logical inverter of the signal ATD.

The enable circuit 178 may generate the signal EN in the same state as the signal SE. A new ATD event during an ongoing cycle (e.g., the signal EN is in the logical HIGH state) may cause the enable circuit 178 to toggle the signal EN to the logical LOW state and then to the logical HIGH state. The enable circuit 178 may transition the signal DEN rapidly from the logical HIGH state to the logical LOW state when the signal SE transitions from the logical HIGH state to the logical LOW state. The signal DEN may transition relatively slower from the logical LOW state to the logical HIGH state when the signal SE transitions from the logical LOW state to the logical HIGH state.

The dummy sense amplifier 168 may sense the signals D and DB to generate the signal DSA_O while the signal DEN is in the logical HIGH state. The signal DSA_O may be generated in the logical HIGH state while the signals D and DB are closer than the predetermined voltage separation. The signal DSA_O may be generated in the logical LOW state while the signal D and DB are separated by at least the predetermined voltage separation. The dummy sense amplifier 168 may tri-state an output for the signal DSA_O while the signal DEN is in the logical LOW state.

The reset latch circuit 170 may hold a state of the signal DSA_O. The reset latch circuit 170 generally comprises an inverter 184 and an inverter 186 couple together in a closed loop. Another inverter 188 may be provided to present the state of the reset latch as the signal DUMS_WAIT.

The pass gate circuit 172 generally comprises a transistor 190, a transistor 192, and an inverter 193. The transistors 190 and 192 either pass or block the reset signal (e.g., DUMS_WAIT from the reset latch circuit 170, DUMS to the control circuit 136) based upon the signal ATD and the signal ATDB2. The inverter 193 may invert the signal ATD to generate the signal ATDB2.

The bias circuit 174 may bias the signal DUMS toward the de-asserted state (e.g., the logical HIGH state) while the signal ATDB2 is in the logical LOW state. The bias circuit 174 may be implemented as a p-channel MOS transistor. While the pass gate circuit 172 is closed, the inverter 188 may drive the signals DUMS_WAIT, and thus the signal DUMS, to the logical LOW state. While the pass gate circuit 172 is blocking the signal DUMS_WAIT from the reset latch circuit 170, the bias circuit 174 may pull the signal DUMS to the de-asserted state (e.g., the logical HIGH state).

The driver circuit 176 may drive the reset latch circuit 170 to the de-asserted state based upon the signals SE and ATDB2. When either or both of the signals SE and ATDB2 are in the logical LOW state, the driver circuit 176 generally pulls an input to the inverter 184 to the logical HIGH state. Therefore, the reset signal DUMS_WAIT is also forced to the logical HIGH state (e.g., the de-asserted state). While both of the signals SE and ATDB2 are in the logical HIGH state, the driver circuit 176 generally presents a high impedance to the input of the inverter 184.

The signal SEB in the logical HIGH state may cause the transistors 180A–B to conduct or switch on. While on, the transistors 180A–B may charge the dummy bit lines 106A–B respectively to a predetermined voltage or charge. The signal SEB in the logical LOW state may cause the transistors 180A–B to stop conducting or switch off. While off, the transistors 180A–B may present a high impedance to the dummy bit lines 106A–B.

Figure 4:
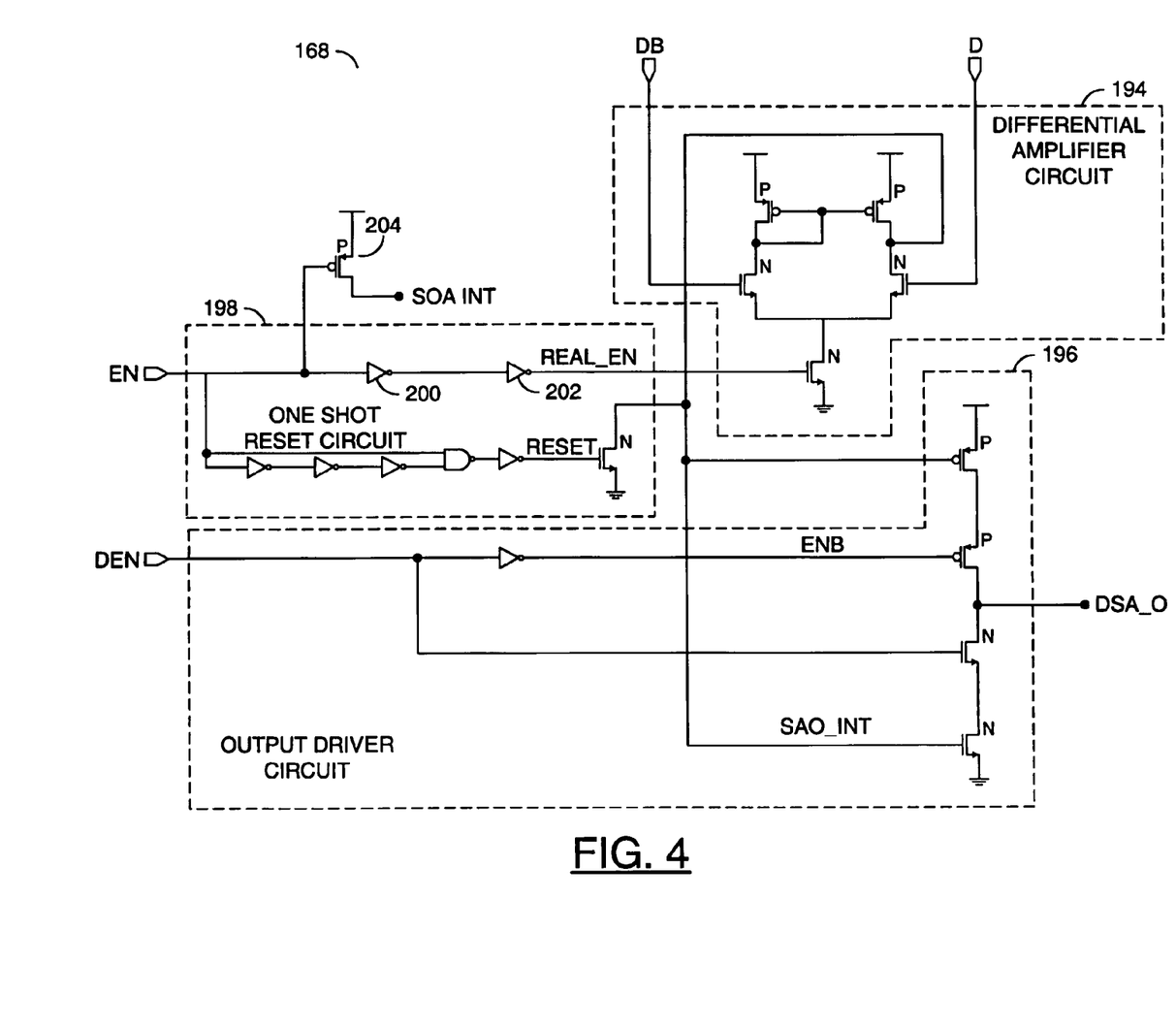
FIG. 4 is a schematic of an example implementation of a dummy sense amplifier circuit.

Referring to FIG. 4, a schematic of an example implementation of the dummy sense amplifier 168 is shown. The dummy sense amplifier circuit 168 generally comprises a differential amplifier circuit 194, an output driver circuit 196, a one-shot reset circuit 198, an inverter 200, an inverter 202, and a transistor 204. Other implementations may be provided to meet the design criteria of a particular application.

The differential amplifier circuit 194 may generate a signal (e.g., SAO_INT) in response to the signals D and DB. The signal SAO_INT may be implemented as an internal differential sense amplifier output signal. The output driver circuit 196 may invert the signal SAO_INT to generate the signal DSA_O. The signal DEN may enable and disable the output driver circuit 196. The one-shot reset circuit 198 may receive the signal EN. The one-shot reset circuit 198 may be configured to momentarily pull-down the signal SAO_INT. The signal EN may be buffered by the inverters 200 and 202 and then presented to the differential amplifier circuit 194. The transistor 204 may buffer the signal EN for presentation external to the dummy sense amplifier circuit 168.

A new ATD event during an ongoing cycle generally causes the signal EN to toggle from the logical HIGH state to the logical LOW state and then back to the logical HIGH state. While the signal EN is in the logical LOW state, the differential amplifier circuit 194 may be disabled and the one-shot reset circuit 198 may remain idle. When the signal EN transitions from the logical LOW state to the logical HIGH state, the differential amplifier circuit 194 may become enabled and the one-shot reset circuit 198 may momentarily pull the signal SAO_INT to the logical LOW state. The output driver circuit 196 may generate the signal DSA_O in the logical HIGH state (e.g., the de-asserted state) while the signal SAO_INT is in the logical LOW state. In turn, the signal DSA_O in the logical HIGH state may force the latch circuit 170 into the de-asserted state. While the one-shot reset circuit 198 is cycling, the differential amplifier circuit 194 may simultaneously and/or concurrently start a new dummy read of the fixed logical value of the dummy bit cell/precharge circuit 102. Therefore, the one-shot reset circuit 198 should generally have a pulse duration shorter than a minimum sense time of the dummy bit cell/precharge circuit 102.

Figure 5:
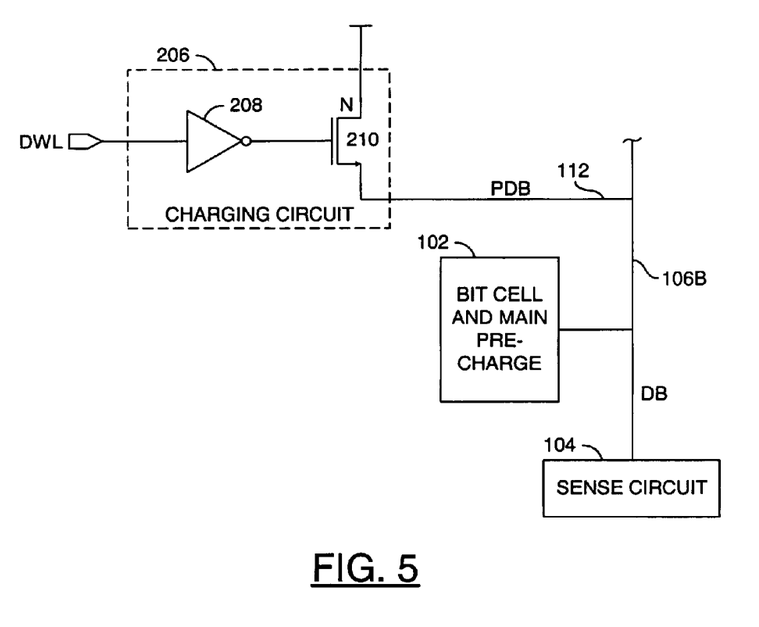
FIG. 5 is a schematic of a driver circuit.

Referring to FIG. 5, a schematic of an example implementation for a charging circuit 206 is shown. The charging circuit 206 may form part of the logic circuit 110 (FIG. 1). The charging circuit 206 generally comprises an inverter 208 and a transistor 210. Other implementations may be provided to meet the design criteria of a particular application.

The inverter 208 may receive the signal DWL and generate a signal (e.g., DBPULLT) presented to the transistor 210. The transistor 210 may be implemented as an n-channel MOS transistor in a pull-up configuration. A gate of the transistor 210 may receive the signal DBPULLT. A source of the transistor 210 may be coupled to the power source VCC. A drain of the transistor 210 may present the signal PDB. The signal DBPULLT may be implemented as a dummy bit line pull-up enable signal and/or a logical inverse of the signal DWL.

The logical HIGH pulse formed by the signal ATD may cause a logical LOW pulse in the signal DWL. The transistor 210 may conduct during the logical LOW pulse formed by the signal DWL. While the transistor 210 is conducting, the signal PDB may reset (e.g., charge) a falling dummy bit line (e.g., the dummy bit line 106B). A conductor 212 may couple the signal PDB to the dummy bit line 106B. The conductor 212 may connect with the dummy bit line 106B on a side of the dummy bit cell/precharge circuit 102 opposite that of the sense circuit 104. Since the dummy bit lines 106A–B may form a transmission line, transitioning dummy bit lines 106A–B may have a larger differential voltage near the conductor 212 than near the sense circuit 104. Therefore, charging the dummy bit line 106B proximate the dummy bit cell/precharge circuit 102 may result in a faster reset of the dummy bit line 106B than if charging were performed close to the sense circuit 104. Likewise for all other bit lines 106, a global precharge event may triggered by the new ATD event.

As described above, the memory circuit 100 generally incorporates several underlying features that alone and/or in combination allow for smooth operation when an ATD event occurs during an ongoing cycle. A "set" operation caused by the signal ATD on the control latch 162 is generally stronger than the "reset" operation caused by the dummy sense amplifier circuit 168. The set transistor 138 may have a drive strength much greater than the reset transistor 137. Another feature may be that a reset path for the control latch 162 may be broken by the pulsing of the signal ATD. Before, during, and after the reset signal DUMS_WAIT generated by the sense circuit 104 is broken or blocked, the reset signal DUMS that drives toward the control latch 162 may be biased to the de-asserted state by the bias circuit 174. The pulse formed by the signal ATD may also reset the dummy sense amplifier circuit 168 and de-assert the reset signal DUMS_WAIT prior to reconnecting the reset signal DUMS_WAIT to the reset transistor 137. The reset latch 170 of the dummy sense circuit 104 may be reset and a local precharge at the inputs of the dummy sense amplifier circuit 168 may be performed. An internal state of several nodes in the dummy sense amplifier circuit 168 may be reset in response to the signal ATD pulse. Finally, the top of the falling bit line of the dummy bit line pair 106A–B may be pulled up or reset during signal ATD pulse. As a result, potential holes in an address transition space caused by overlapping ATD initiated cycles may be removed.

The various signals of the present invention are generally "on" (e.g., a digital HIGH, logical HIGH, or 1) or "off" (e.g., a digital LOW, logical LOW, or 0). However, the particular polarities of asserted and de-asserted states of the signals may be adjusted (e.g., reversed) accordingly to meet the design criteria of a particular implementation. Additionally, inverters may be added to change a particular polarity of the signals.

As used herein, the term "simultaneously" is meant to describe events that share some common time period but the term is not meant to be limited to events that begin at the same point in time, end at the same point in time, or have the same duration.

It will be apparent to those skilled in the relevant art(s) that certain nodes of transistors and other semiconductor devices may be interchanged and still achieve the desired electrical characteristics. The node interchanging may be achieved physically and/or electrically. Examples of transistor nodes that may be interchanged include, but are not limited to, the emitter and collector of bipolar transistors, the drain and source of field effect transistors, and the first base and second base of unijunction transistors.

While the invention has been particularly shown and described with reference to the preferred embodiments thereof, it will be understood by those skilled in the art that various changes in form and details may be made without departing from the spirit and scope of the invention.

What is claimed is:

1. A memory circuit comprising:
    a bit cell configured to generate a bit signal having a fixed logic value;
    a sense amplifier configured to generate a reset signal in response to sensing said bit signal; and
    a control circuit configured to (i) set a control latch in response to a detection signal and (ii) reset said control latch in response to said reset signal, wherein said control latch is set while both said detection signal and said reset signal are in an asserted state to halt a self-timed read cycle.

2. The memory circuit according to claim 1, further comprising a detection circuit configured to generate said detection signal in said asserted state in response to detecting a transition of an address signal.

3. The memory circuit according to claim 1, further comprising a pass gate configured to block said reset signal generated by said sense amplifier in response to said detection signal.

4. The memory circuit according to claim 1, further comprising a bias circuit configured to generate said reset signal in a de-asserted state to said control circuit in response to said detection signal.

5. The memory circuit according to claim 1, further comprising:
    a pair of bit lines conveying said bit signal from said bit cell to said sense amplifier; and
    a charging circuit configured to reset at least one of said bit lines in response to said detection signal.

6. The memory circuit according to claim 1, further comprising
    a reset latch configured to latch said reset signal as generated by said sense amplifier.

7. The memory circuit according to claim 6, further comprising a driver circuit configured to drive said reset latch to a de-asserted state in response to said detection signal.

8. The memory circuit according to claim 7, wherein said control circuit is further configured to generate an enable signal in response to said detection signal.

9. The memory circuit according to claim 8, wherein said driver circuit is further configured to drive said reset latch to said de-asserted state in response to said enable signal.

10. The memory circuit according to claim 1, wherein said sense amplifier is further configured to generate said reset signal in a de-asserted state in response to said detection signal transitioning from said asserted state to said de-asserted state.

11. The memory circuit according to claim 1, wherein said sense amplifier is further configured to start a new read of said bit cell in response to said detection signal transitioning from said asserted state to a de-asserted state.

12. The memory circuit according to claim 1, further comprising:
- a pass gate configured to block said reset signal generated by said sense amplifier in response to said detection signal;
- a bias circuit configured to generate said reset signal in a de-asserted state to said control circuit in response to said detection signal;
- a pair of bit lines conveying said bit signal from said bit cell to said sense amplifier;
- a charging circuit configured to reset at least one of said bit lines in response to said detection signal;
- a reset latch configured to latch said reset signal as generated by said sense amplifier; and
- a driver circuit configured to drive said reset latch to said de-asserted state in response to said detect signal.

13. A method of operating a memory circuit comprising the steps of:
- (A) generating a bit signal having a fixed logic value;
- (B) generating a reset signal in response to sensing said bit signal;
- (C) setting a control latch in response to a detection signal; and
- (D) resetting said control latch in response to said reset signal, wherein said control latch is set while both said detection signal and said reset signal are in an asserted state to halt a self-timed read cycle.

14. The method according to claim 13, further comprising the step of generating said detection signal in said asserted state in response to detecting a transition of an address signal.

15. The method according to claim 13, further comprising the step of blocking said reset signal in response to said detection signal.

16. The method according to claim 13, further comprising the step of generating said reset signal in a de-asserted state in response to said detection signal.

17. The method according to claim 13, further comprising the steps of:
- conveying said bit signal in two portions from a first location to a second location; and
- resetting at least one of said portions in response to said detection signal.

18. The method according to claim 13, further comprising the step of:
- latching said reset signal at a location.

19. The method according to claim 13, further comprising the step of:
- generating an enable signal in response to said detection signal.

20. The method according to claim 13, further comprising the step of:
- generating said reset signal in a de-asserted state in response to said detection signal transitioning from said asserted state to said de-asserted state.

21. The method according to claim 13, further comprising the step of:
- starting a new read of said bit signal in response to said detection signal transitioning from said asserted state to a de-asserted state.

22. The method according to claim 18, further comprising the step of:
- driving said reset signal to a de-asserted state at said location in response to said detection signal.

23. The method according to claim 19, further comprising the step of:
- driving said reset signal to said de-asserted state in response to said enable signal.

24. A memory circuit comprising:
- means for generating a bit signal having a fixed logic value;
- means for generating a reset signal in response to sensing said bit signal;
- means for setting a control latch in response to a detection signal; and
- means for resetting said control latch in response to said reset signal, wherein said control latch is set while both said detection signal and said reset signal are in an asserted state to halt a self-timed read cycle.

* * * * *